US012279364B2

(12) United States Patent
Choi et al.

(10) Patent No.: US 12,279,364 B2
(45) Date of Patent: Apr. 15, 2025

(54) PRINTED CIRCUIT BOARD WITH PLURALITY OF CONDCTOR PATTERNS AND VIAS

(71) Applicant: SAMSUNG ELECTRO-MECHANICS CO., LTD., Suwon-si (KR)

(72) Inventors: Jae Woong Choi, Suwon-si (KR); Jae Ho Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 198 days.

(21) Appl. No.: 18/106,129

(22) Filed: Feb. 6, 2023

(65) Prior Publication Data

US 2024/0179830 A1    May 30, 2024

(30) Foreign Application Priority Data

Nov. 29, 2022    (KR) .......................... 10-2022-0163065

(51) Int. Cl.
*H05K 1/02*    (2006.01)
*H05K 1/11*    (2006.01)
(Continued)

(52) U.S. Cl.
CPC ........... *H05K 1/0224* (2013.01); *H05K 1/115* (2013.01); *H05K 3/107* (2013.01); *H05K 3/188* (2013.01);
(Continued)

(58) Field of Classification Search
CPC ...... H05K 1/0224; H05K 1/115; H05K 3/107; H05K 3/188; H05K 2201/09036;
(Continued)

(56) References Cited

U.S. PATENT DOCUMENTS 7,005,742 B2 *    2/2006    Hodson .................... H01L 24/13
257/E21.511
7,562,447 B2 *    7/2009    Lee .......................... H05K 3/045
29/846

(Continued)

FOREIGN PATENT DOCUMENTS

CN    101106861 A  *  1/2008  ............. H05K 3/429
CN    102026474 A  *  4/2011  ........... H04N 5/2253
(Continued)

*Primary Examiner* — Binh B Tran
*Assistant Examiner* — Muhammed Azam
(74) *Attorney, Agent, or Firm* — Morgan, Lewis & Bockius LLP

(57) ABSTRACT

The present disclosure relates to a printed circuit board. The printed circuit board includes a plurality of insulating layers each having a plurality of concave portions; a plurality of conductor pattern layers disposed in a plurality of concave portions of each of the plurality of insulating layers; first and second via holes connected to one of the plurality of concave portions independently of each other and penetrating through at least two of the plurality of insulating layers independently of each other; and first and second via conductors disposed in the first and second via holes, respectively, and connecting two of the plurality of conductor pattern layers independently of each other. An average width of the first via conductor is greater than that of the second via conductor on a cross-section.

20 Claims, 6 Drawing Sheets

(51) Int. Cl.
  *H05K 3/10* (2006.01)
  *H05K 3/18* (2006.01)
(52) U.S. Cl.
  CPC .............. *H05K 2201/09036* (2013.01); *H05K 2201/096* (2013.01)
(58) Field of Classification Search
  CPC .. H05K 2201/096; H05K 3/4602; H05K 1/11; H05K 1/02; H05K 1/116; H05K 1/181; H05K 3/18; H05K 3/465
  See application file for complete search history.

(56) References Cited

U.S. PATENT DOCUMENTS

| | | | | |
|---|---|---|---|---|
| 8,072,052 | B2 * | 12/2011 | Ko ................... | H01L 23/49827 |
| | | | | 257/668 |
| 2007/0119541 | A1 * | 5/2007 | Kawabata ............. | H01L 24/82 |
| | | | | 428/209 |
| 2009/0242261 | A1 * | 10/2009 | Takenaka ............. | H05K 1/0271 |
| | | | | 174/262 |
| 2009/0314525 | A1 * | 12/2009 | Kajino .................. | H05K 3/107 |
| | | | | 29/874 |
| 2011/0079420 | A1 * | 4/2011 | Chang .................... | B32B 18/00 |
| | | | | 174/262 |
| 2014/0034359 | A1 * | 2/2014 | Lee ........................ | H05K 3/465 |
| | | | | 216/13 |
| 2015/0027757 | A1 * | 1/2015 | Shin ....................... | H05K 3/107 |
| | | | | 174/255 |
| 2015/0131231 | A1 * | 5/2015 | Yoo ....................... | H05K 3/4007 |
| | | | | 29/841 |

FOREIGN PATENT DOCUMENTS

| | | | | | |
|---|---|---|---|---|---|
| CN | 112425274 | A | * | 2/2021 | ............ H01R 12/57 |
| CN | 118055558 | A | * | 5/2024 | ............ H05K 1/111 |
| CN | 118055566 | A | * | 5/2024 | ............ H05K 1/115 |
| CN | 118057603 | A | * | 5/2024 | ............ H01L 24/03 |
| JP | H07-240568 | A | | 9/1995 | |
| JP | WO2018181678 | A1 | * | 10/2018 | |
| KR | 10-2010-0090806 | A | | 8/2010 | |
| KR | 20110028330 | A | * | 3/2011 | |
| TW | 201444425 | A | * | 11/2014 | ........... H05K 1/0271 |
| TW | 202010075 | A | * | 3/2020 | .......... H01L 23/3114 |
| TW | I771409 | B | * | 7/2022 | |

\* cited by examiner (a)

(b)

(c)

(d)

(e)

(a)

(b)

PRINTED CIRCUIT BOARD WITH PLURALITY OF CONDCTOR PATTERNS AND VIAS

CROSS-REFERENCE TO RELATED APPLICATION (S)

This application claims benefit of priority to Korean Patent Application No. 10-2022-0163065 filed on Nov. 29, 2022, in the Korean Intellectual Property Office, the disclosure of which is incorporated herein by reference in its entirety.

TECHNICAL FIELD

The present disclosure relates to a printed circuit board.

As a semiconductor specification becomes higher, to have a high-specification, the size of a die is increasing, and with an increase in the size of the die, production costs may increase, which may result in enhancing chiplet usage to reduce the costs. Accordingly, there is a need for a technique for interconnection between dies. On the other hand, when connecting the die and the die, a circuit with fine lines/spaces is required, and the surface roughness of the circuit is required to minimize signal loss under high frequency conditions. There is a need for a package substrate structure for improving all of these requirements.

SUMMARY

An aspect of the present disclosure is to provide a printed circuit board for realizing fine lines/spaces and fine vias by forming circuits of an inner layer as well as an outermost layer in a buried trace structure.

Another aspect of the present disclosure is to provide a printed circuit board for minimizing signal loss under a high frequency condition by reducing the surface roughness of a circuit.

Another aspect the present disclosure is to provide a printed circuit board that can easily perform impedance management by variously adjusting the thickness of a circuit pattern.

Another aspect of the present disclosure is to provide a printed circuit board for improving design freedom by forming vias having various depths and widths.

Another aspect of the present disclosure is to provide a printed circuit board for improving the performance of signal integrity (SI) and power integrity (PI).

One of the various aspects proposed through the present disclosure is to form concave portions having various depths and widths in each insulating layer using laser processing, form via holes having various depths and widths, and forming a conductor pattern layer and a via pattern by performing a planarization process fill after filling the concave portions and via holes with plating.

According to an aspect of the present disclosure, a printed circuit board may include a plurality of insulating layers having a plurality of concave portions, respectively; a plurality of conductor pattern layers disposed in the plurality of concave portions of each of the plurality of insulating layers; first and second via holes that are independently connected to one of the plurality of concave portions and penetrate through at least two of the plurality of insulating layers independently of each other; and first and second via conductors disposed in the first and second via holes, respectively, and connecting two of the plurality of conductor pattern layers independently of each other. An average width of the first via conductor may be greater than that of the second via conductor on a cross section.

According to another aspect of the present disclosure, a printed circuit board may include: first to third insulating layers having a plurality of first to third concave portions, respectively, and stacked in a first direction; first to third conductor pattern layers disposed in the plurality of first to third concave portions, respectively; first and second via holes penetrating through the second and third insulating layers, respectively, from different one of the plurality of third concave portions to the other portion of the first conductor pattern layer; and first and second via conductors disposed in the first and second via holes, respectively, and connecting the first and third conductor pattern layers in different positions. At the same level with respect to the first direction, the width of the first via hole in a second direction perpendicular to the first direction may be greater than that of the second via hole.

According to another aspect of the present disclosure, a printed circuit board may include: a first insulating layer having first and second concave portions; first and second conductor patterns disposed in the first and second concave portions, respectively; a second insulating layer disposed on the first insulating layer and having third and fourth concave portions; third and fourth conductor patterns disposed in the third and fourth concave portions, respectively; and a first via conductor disposed in the second insulating layer to connect the first and third conductor patterns to each other. The third conductor pattern may have a width greater than that of the fourth conductor pattern, and the third conductor pattern may have a depth greater than that of the fourth conductor pattern.

An effect of the present disclosure is to provide a printed circuit board for realizing fine lines/spaces and fine vias by forming circuits of an inner layer as well as an outermost layer in a buried trace structure.

Another effect of the present disclosure is to provide a printed circuit board for minimizing signal loss under a high frequency condition by reducing the surface roughness of a circuit.

Another effect of the present disclosure is to provide a printed circuit board that can easily perform impedance management by variously adjusting the thickness of a circuit pattern.

Another effect of the present disclosure is to provide a printed circuit board for improving design freedom by forming vias having various depths and widths.

Another aspect of the present disclosure is to provide a printed circuit board for improving the performance of signal integrity (SI) and power integrity (PI).

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
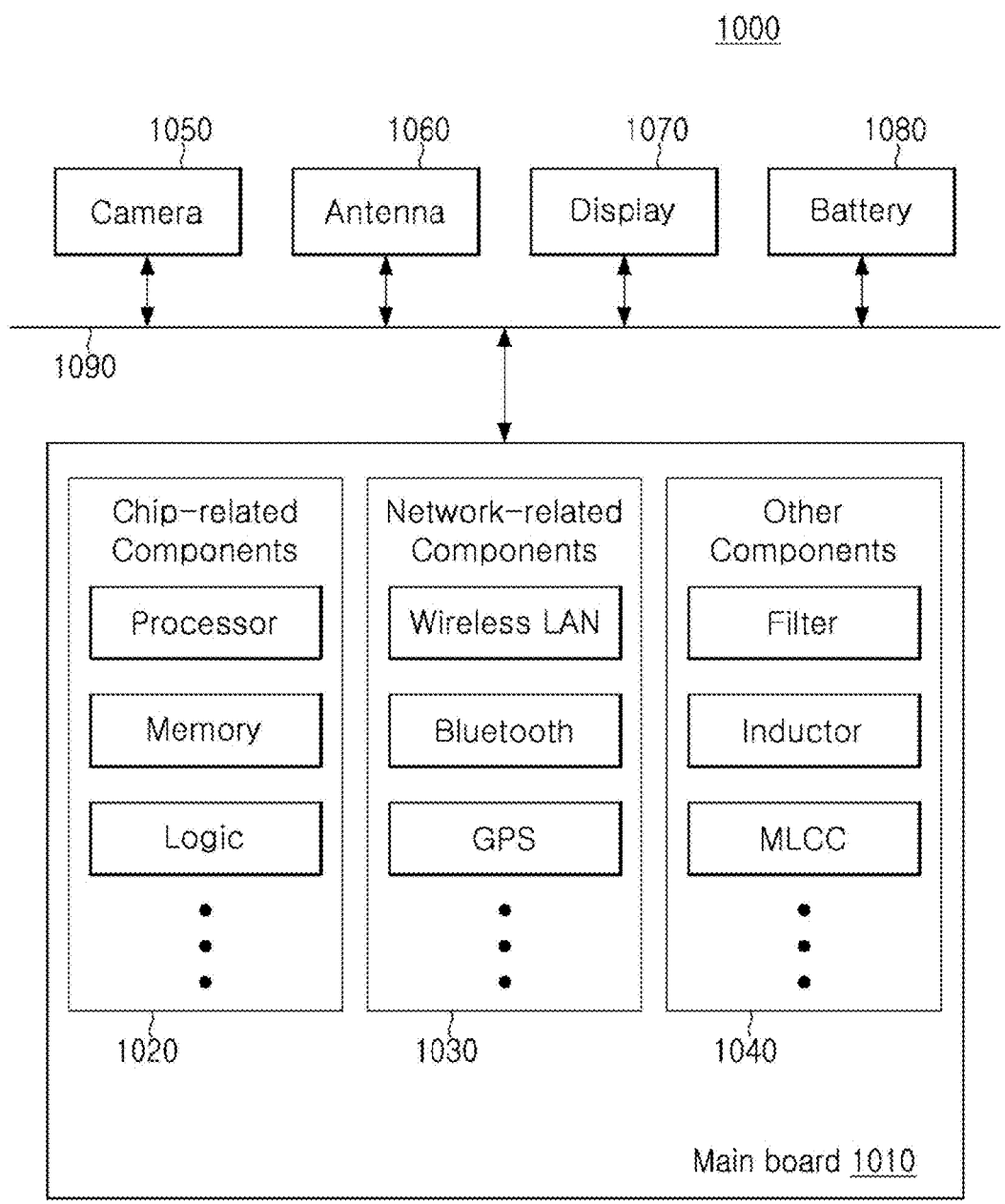
FIG. 1 is a block diagram schematically illustrating an example embodiment of an electronic device system.

Hereinafter, embodiments of the present disclosure will be described with reference to the attached drawings. In the drawings, the shapes and dimensions of elements may be exaggerated or reduced for clarity.

Electronic Device

FIG. 1 is a block diagram schematically illustrating an embodiment of an electronic device system.

Referring to FIG. 1, an electronic device 1000 accommodates a main board 1010 therein. Chip-related components 1020, network-related components 1030, and other components 1040 are physically and/or electrically connected to the main board 1010. These components may also be combined with other electronic components described below to form various signal lines 1090.

The chip-related components 1020 may include a memory chip such as a volatile memory (e.g., a dynamic random access memory (DRAM)), a non-volatile memory (e.g., a read only memory (ROM)), and a flash memory, or the like; an application processor chip such as a central processor (e.g., a graphics processing unit (GPU)), a graphics processor (e.g., a graphics processing unit (GPU)), a digital signal processor, an cryptographic processor, a microprocessor, a microcontroller, or the like; and a logic chip such as an analog-to-digital converter, an application-specific integrated circuit (ASIC), or the like. However, the chip-related components 1020 is not limited thereto, may also include other types of chip-related electronic components. In addition, the chip-related components 1020 may be coupled to each other. The chip-related components 1020 may be in the form of a package including the above-described chip or electronic component.

The network-related components 1030 may include protocols such as wireless fidelity (Wi-Fi) (Institute of Electrical and Electronics Engineers (IEEE) 802.11 family, or the like), WiMAX (IEEE 802.16 family, or the like), IEEE 802.20, long term evolution (LTE), evolution data only (Ev-DO), HSPA+, HSDPA+, HSUPA+, EDGE, GSM, GPS, GPRS, CDMA, TDMA, DECT, Bluetooth, 3G, 4G, and 5G protocols, and any other designated after the wireless and wired protocols abovementioned protocols. However, the network related components 1030 are not limited thereto, and may also include a variety of other wireless or wired standards or protocols. In addition, the network-related components 1030 may be combined with each other, together with the chip-related components 1020 described above.

Depending on a type of electronic device 1000, electronic device 1000 may include other electronic components that may or may not be physically and/or electrically connected to the main board 1010. Other electronic components include, for example, a camera module 1050, an antenna module 1060, a display 1070, and a battery 1080. However, these other components are not limited thereto, and also include an audio codec, a video codec, a power amplifier, a compass, an accelerometer, a gyroscope, a speaker, a mass storage device (e.g., a hard disk drive), a compact disk (CD), and a digital veritable disk (DVD). In addition, these other components may include other components used for various purposes depending on a type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
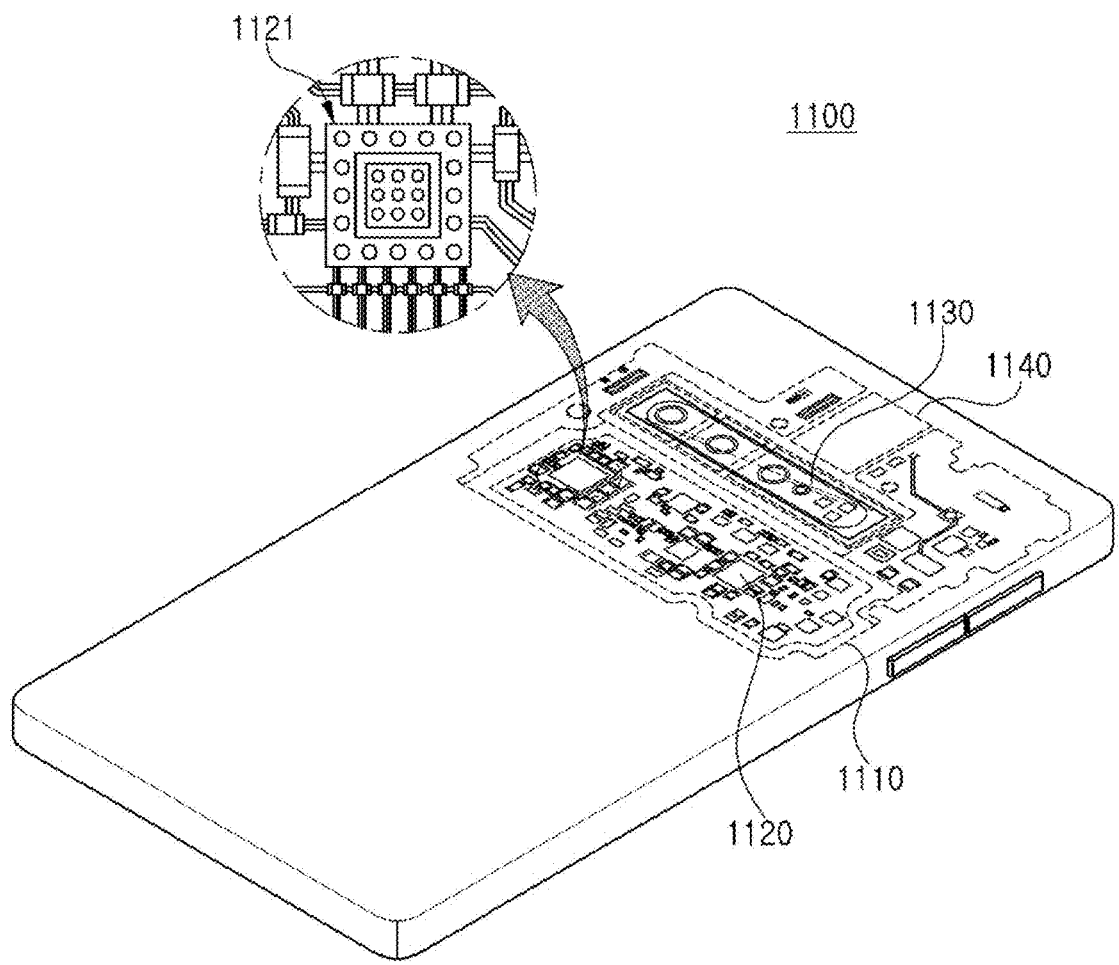
FIG. 2 is a perspective view schematically illustrating an example embodiment of an electronic device.

FIG. 2 is a schematic perspective view illustrating an example embodiment of an electronic device.

Referring to FIG. 2, the electronic device may be, for example, a smartphone 1100. A motherboard 1110 may be accommodated inside the smartphone 1100, and various components 1120 are physically and/or electrically connected to the motherboard 1110. In addition, other components such as a camera module 1130 and/or a speaker 1140 that may or may not be physically and/or electrically connected to the motherboard 1110 are accommodated inside. Some of the components 1120 may be the chip-related components described above, for example, the component package 1121, but the present disclosure is not limited thereto. The component package 1121 may be in the form of a printed circuit board in which electronic components including an active component and/or a passive component are surface-mounted. Alternatively, the component package 1121 may be in the form of a printed circuit board in which an active component and/or a passive component are embedded. Meanwhile, the electronic device is not necessarily limited to the smartphone 1100, and may be another electronic device as described above.

Printed Circuit Board

Figure 3:
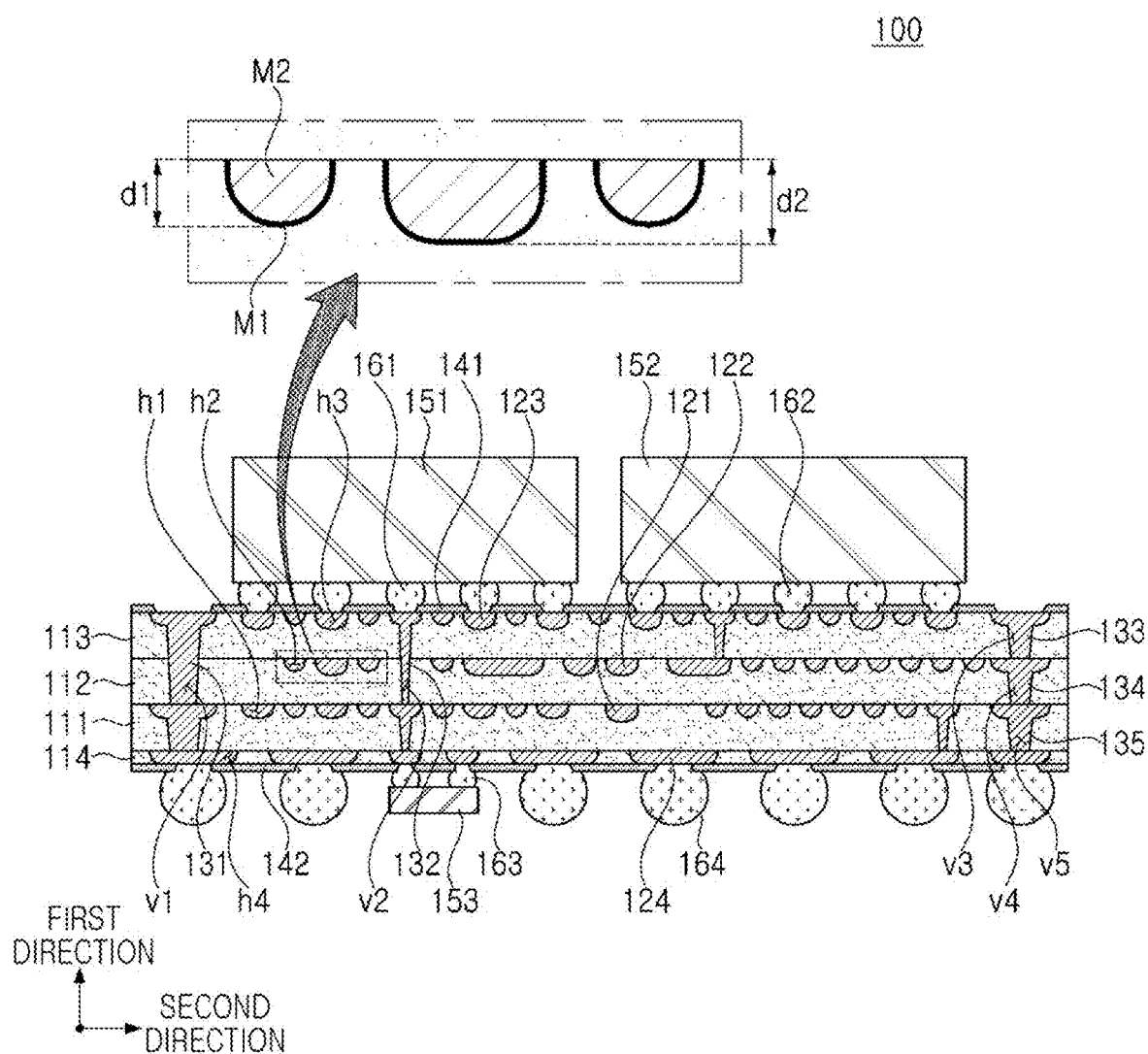
FIG. 3 is a cross-sectional view schematically illustrating an example embodiment of a printed circuit board.

FIG. 3 is a cross-sectional view schematically illustrating an example embodiment of a printed circuit board.

Referring to FIG. 3, the printed circuit board 100 according to an example embodiment may include first to third insulating layers 111, 112 and 113 stacked in a first direction and having a plurality of first to third concave portions h1, h2 and h4, respectively, first to third conductor pattern layers 121, 122 and 123 filling a plurality of first to third concave portions h1, h2, and h3, respectively, first and second via holes v1 and v2 penetrating the second and third insulating layers 112 and 113, respectively, from different one of the plurality of third concave portions h3 to the other portion of the first conductor pattern layer 121, and first and second via conductors 131 and 132 filling the first and second via hole v1 and v2 and electrically connecting the first and third conductor pattern layers 121 and 123 in different positions. As described above, since the printed circuit board 100 according to an example embodiment has a structure in which a concave portion is formed in each insulating layer and then filled with a conductor to form a conductor pattern layer, the circuits of an inner layer as well as an outermost layer can be formed in a buried trace structure to realize fine lines/spaces and fine vias.

Meanwhile, an upper surface of each of the first to third conductor pattern layers 121, 122 and 123 may be substantially coplanar with an upper surface of each of the first to third insulating layers 111, 112 and 113. In addition, a lower surface of each of the first to third conductor pattern layers may have a form in which corners are rounded. As described above, since the printed circuit 100 according to an example embodiment forms a conductor pattern layer without etching, each surface of the conductor pattern layer may have a smooth shape with little surface roughness, and the signal path may be shortened in a skin effect phenomenon, thereby minimizing signal loss under a high frequency condition and improving signal integrity (SI) characteristics.

Meanwhile, a plurality of first concave portions h1, a plurality of second concave portions h2, and/or a plurality of third concave portions h3 may each include a plurality of concave portions having different depths. For example, the plurality of second concave portions h2 may include conductor pattern layers 122 having different depths d1 and d2. With an increase in the width of the cross-section of the concave portion, the depth of the concave portion may increase, but the present disclosure is not limited thereto. As such, the printed circuit board 100 according to an example embodiment can adjust the thickness of the circuit pattern in various ways to easily manage impedance, and can improve power integrity (PI).

Meanwhile, the first via conductor 131 may be electrically connected to power patterns of the first and third conductor pattern layers 121 and 123, and the second via conductor 132 may be electrically connected to signal patterns of each of the first and third conductor pattern layers 121 and 123. At the same level with respect to the first direction, for example, when drawing an arbitrary virtual line in a second direction perpendicular to the first direction, the width of the first via hole v1 filled with the first via conductor 131 may be wider than the width of the second via hole v2 filled with the second via conductor 132 at a position meeting the virtual line. As described above, the printed circuit board 100 according to an example embodiment may improve the degree of design freedom by forming vias having various depths and widths. For example, the first via conductor 131 may have a seamless via shape and may have a wide width at the same time to improve a heat dissipation effect and PI characteristics in terms of inductance. In addition, the second via conductor 132 may be finely formed while having the seamless via shape, thereby improving SI characteristics.

Meanwhile, the first and second via holes v1 and v2 may be formed independently of each other. For example, when the printed circuit board 100 is more multi-layered, the first and second via holes v1 and v2 may be independently connected to one of the plurality of concave portions of each insulating layer and may penetrate through at least two of the plurality of insulating layers independently of each other. That is, the first and second via holes v1 and v2 may be independently formed in other shapes as well as in the shapes illustrated in the drawings. For example, the first via hole v1 may penetrate three insulating layers, while the second via hole v2 may penetrate only two insulating layers. In addition, penetration start positions of the first via hole v1 and the second via hole v2 may disposed in different layers. That is, the first and second via conductors 131 and 132 may independently electrically connect two of the plurality of conductor pattern layers. In this case, the average width of the first via conductor 131 may be different from that of the second via conductor 132 on a cross-section, and for example, the average width of the first via conductor 131 may be greater than that of the second via conductor 132. The average width can be derived by calculating the width at any five points on the cross-section and obtaining the average value. Meanwhile, two of the plurality of conductor pattern layers connected to the first via conductor 131 may include power patterns connected to the first via conductor 131, and two of the plurality of conductor pattern layers connected to the second via conductor 132 may include signal patterns connected to the second via conductor 132. As described above, the printed circuit board 100 according to an example embodiment may have the above-described effect of improving the degree of design freedom even when the printed circuit board 100 is more multi-layered.

Meanwhile, the first to third conductor pattern layers 121, 122 and 123 may include a first metal layer M1 covering inner walls of each of the plurality of first to third concave portions h1, h2 and h3, respectively, and a second metal layer M2 that is disposed on the first metal layer M1 and fills the plurality of first to third concave portions h1, h2 and h3, respectively. The first metal layer M1 may be a seed layer, for example, an electroless plating layer and/or a sputtering layer. The second metal layer M2 may be a plating layer, for example, an electric plating layer. Each of the first and second metal layers M1 and M2 includes copper Cu, and boundaries thereof may be distinguished from each other. The first metal layer M1 may has a substantially constant thickness, which is thinner than the second metal layer M2, and may cover inner walls of each of the plurality of first to third concave portions h1, h2 and h3, and the second metal layer M2 may substantially completely fill each of the plurality of first to third concave portions h1, h2 and h3. The first and second via conductors 131 and 132 may also include the first and second metal layers M1 and M2 in a shape similar thereto. In this way, in the first to third conductor pattern layers 121, 122 and 123, the circuits of the inner layer as well as the outermost layer may be formed in the buried trace structure, thereby realizing fine lines/spaces and fine vias.

On the other hand, the printed circuit board 100 according to an example embodiment may further include a third via hole v3 penetrating the third insulating layer 113 from one of the plurality of third concave portion h3 to a portion of the second conductor pattern layer 122, a fourth via hole v4 penetrating the second insulating layer 112 from one of the plurality of second concave portions h2 to a portion of the first conductor pattern layer 121, a third via conductor 133 filling the third via hole v3 and electrically connecting the second and third conductor pattern layers 122 and 123, and a fourth via conductor 134 filling the fourth via hole v4 and electrically connecting the first and second conductor pattern layers 121 and 122. As described above, in addition to the seamless via shape, various types of vias for interlayer connection may be applied.

On the other hand, the printed circuit board 100 according to an example embodiment further include a fourth insulating layer 114 having the plurality of fourth concave portions h4 and stacked on a lower side of the first insulating layer 111 with respect to the first direction, a fourth conductor pattern layer 124 filling the plurality of fourth concave portions h4, a fifth via hole v5 penetrating the first insulating layer from the plurality of first concave portions h1 to a portion of the fourth conductor pattern layer 124, and a fifth via conductor 135 filling the fifth via hole v5 and electrically connecting the first and fourth conductor pattern layers 121 and 124. The fourth insulating layer 114 and the fourth conductor pattern layer 124 may be outermost layers of the substrate, and the thickness of the fourth insulating layer 114 may be less than those of the first to third insulating layers 111, 112 and 113, but the present disclosure is not limited thereto. The descriptions of the plurality of first to third concave portions h1, h2 and h3 and the first to third conductor pattern layers 121, 122 and 123, described above, may be applied to the plurality of fourth concave portions h4 and the fourth conductor pattern layer 124 in substantially the same manner.

On the other hand, although not illustrated in the drawings, the printed circuit board 100 according to an example embodiment may further include a fifth insulating layer having a plurality of fifth concave portions between the first and second insulating layers 111 and 112 or between the second and third insulating layers 112 and 113 with respect to the first direction. The plurality of fifth concave portions may be filled with a fifth conductor pattern layer. The first and second via holes v1 and v2 may further penetrate the fifth insulating layer. If necessary, more insulating layers and conductive pattern layers as well as the fifth insulating layer and the fifth conductive pattern layer may be further disposed in necessary positions. That is, the printed circuit board 100 may be formed of a more multilayer substrate. The descriptions of the plurality of the first to third concave portions h1, h2 and h3 and the first to third conductor pattern layers 121, 122 and 123 described above may be applied to the plurality of fifth concave portions and the fifth conductor pattern layers in substantially the same manner.

Meanwhile, the printed circuit board 100 according to an example embodiment may be a coreless type substrate including a build-up unit. The build-up unit may include the first to third insulating layers 111, 112 and 113, the first to third conductor pattern layers 121, 122 and 123, the first and second via holes v1 and v2, the first and second via conductors 131 and 132, the third and fourth via holes v3 and v4, the third and fourth via conductors 133 and 134, and the fourth insulating layer 114, the fourth conductor pattern layer 124, the fifth via hole v5, the fifth via conductor 135, the fifth insulating layer, and the fifth conductor pattern layer. As described above, since the printed circuit board 100 according to an example embodiment may implement all layers or most layers in the buried trace structure, it can be easily applied to a coreless substrate.

On the other hand, the coreless type substrate may further include first and second resist layers 141 and 142 disposed on an upper side and a lower side of the build-up unit, respectively, with respect to the first direction, first and second semiconductor chips 151 and 152 mounted on an upper side of the first resist layer 141 through a plurality of first and second connection members 161 and 162 with respect to the first direction and electrically connected to the build-up unit, respectively, a passive component 153 mounted on a lower side of the second resist layer 142 through a plurality of third connection members 163 with respect to the first direction and electrically connected to the build-up unit, and a plurality of fourth connection members 164 disposed on the lower side of the second resist layer 142 with respect to the first direction and electrically connected to the build-up unit, respectively. As described above, the printed circuit board 100 according to an example embodiment may be a package substrate.

Hereinafter, with reference to the drawings, components of the printed circuit board 100 according to an example embodiment will be described in more detail.

Each of the first to fourth insulating layers 111, 112, 113 and 114 may include an insulating material. The insulating material may include a thermosetting resin such as an epoxy resin, a thermoplastic resin such as polyimide, or a material including an inorganic filler, an organic filler, and/or glass fiber (e.g., glass fiber, glass cloth, and/or glass fabric) along with such resins. The insulating material may be a photosensitive material and/or a non-photosensitive material. For example, the insulating material may be an insulating material such as Prereg (PPG), Ajinomoto Build-up Film (ABF) or resin coated copper (RCC), but the present disclosure is not limited thereto, and the insulating material may be a photoimageable dielectric (PID) as needed. If necessary, other polymer materials with excellent rigidity may be used as insulating materials.

Each of the first to fourth conductor pattern layers 121, 122, 123 and 124 may include a metal material. Copper (Cu), aluminum (Al), silver (Ag), tin (Sn), gold (Au), nickel (Ni), lead (Pb), titanium (Ti), or alloys thereof, may be used as a metal material. The first to fourth conductor pattern layers 121, 122, 123 and 124 may include an electroless plating layer (or a chemical copper) and an electrolytic plating layer (or an electric copper), but the present disclosure is not limited thereto. As the electroless plating layer, a sputtering layer may be formed instead of chemical copper. The first to fourth conductor pattern layers 121, 122, 123 and 124 may perform various functions according to the design of the corresponding layer, respectively. For example, the first to fourth conductor pattern layers 121, 122, 123 and 124 may include a ground pattern, a power pattern, and a signal pattern. Here, the signal pattern may include various signals except the ground pattern, the power pattern, for example, a data signal. Each of these patterns may include a line pattern, a plane pattern, and/or a pad pattern.

Each of the first to fifth via conductors 131, 132, 133, 134 and 135 may include a metal material. The metal material may include copper (Cu), aluminum (Al), silver (Ag), tin (Sn), gold (Au), nickel (Ni), lead (Pb), titanium (Ti), and/or alloys thereof. Each of the first to fifth via conductors 131, 132, 133, 134 and 135 may perform various functions depending on designs thereof. For example, a ground via, a power via, a signal via, etc., may be included. Here, the signal via may include a via for electrical connection such as various signals except a ground, power, etc., for example, a data signal. Each of the first to fifth via conductors 131, 132, 133, 134 and 135 may have tapered shapes. For example, each of the first to fifth via conductors 131, 132, 133, 134 and 135 may have a tapered shape with a lower width narrower than an upper width on a cross section. The first to fifth via conductors 131, 132, 133, 134 and 135 may be formed together with at least one of the first to third conductor pattern layers 121, 122 and 123, respectively, in the same plating process, and the via conductors and the conductor pattern layers are integrated with each other, but the present disclosure is not limited thereto. The first to fifth via conductors 131, 132, 133, 134 and 135 may include an electroless plating layer (or chemical copper) and an electrolytic plating layer (or electric copper). A sputtering layer may be included instead of the electroless plating layer (or chemical copper), and if necessary, both the sputtering layer and the electroless plating layer (or chemical copper) may be included.

The first and second resist layers 141 and 142 may include an insulating material, and a liquid type or film type solder resist may be used as the insulating material. However, the present disclosure is not limited thereto, and other types of materials may be used. The first resist layer 141 may have at least a portion of the conductor pattern layer disposed on the uppermost side of the build-up unit, for example, a plurality of first openings exposing at least a portion of the third conductor pattern layer 123. The second resist layer 142 may have a plurality of second openings exposing at least a portion of the conductor pattern layer disposed in the lowest side of the build-up unit, for example, at a portion of the fourth conductor pattern layer 124, respectively.

Each of the first and second semiconductor chips 151 and 152 may include an integrated circuit (IC) die provided in an amount of several hundred to several million or more elements integrated in a single chip. In this case, the integrated circuit may be, for example, a central processor (e.g., CPU), a graphics processor (e.g., GPU), a field programmable gate array (FPGA), a digital signal processor, a cryptographic processor, a microprocessor, a microcontroller, an application processor (e.g., AP), an analog-to-digital converter, a logic chip such as application-specific IC (ASIC), but the present disclosure is not limited thereto, and the integrated circuit may be another type such as a volatile memory (e.g., DRAM), a non-volatile memory (e.g., ROM), a flash memory, a memory chip such as High Bandwidth Memory (HBM), or Power Management IC (PMIC). The first and second semiconductor chips 151 and 152 may include the same type of die or different types of die.

Each of the first and second semiconductor chips 151 and 152 may be formed based on an active wafer, and in this case, silicon (Si), germanium (Ge) and gallium arsenide (GaAs) may be used as a base material forming each body. Various circuits may be formed in the body. A connection pad may be formed in of the bodies, and the connection pad may include a conductive material such as aluminum (Al), copper (Cu), or the like. The first and second semiconductor chips 151 and 152 may be bare dies, and in this case, a metal bump may be disposed in the connection pad as necessary. The first and second semiconductor chips 151 and 152 may be packaged dies, and in this case, an additional rewiring layer may be formed on the connection pad, and the metal bump may be disposed on the rewiring layer as necessary.

The first and second semiconductor chips 151 and 152 may be mounted on the first resist layer 141 through a plurality of first and second connection members 161 and 162, respectively. For the example, first and second semiconductor chips 151 and 152 may be electrically connected to the conductor pattern layer, for example, the third conductor pattern layer 123, which is disposed in an uppermost side of the build-up unit through a plurality of first and second connection members 161 and 162, respectively. Each of a plurality of first and second connection members 161 and 162 may be formed of a low melting point metal, for example, a solder such as tin (Sn)-aluminum (Al)-copper (Cu), or the like, but this is only an example, and the material is not particularly limited thereto.

The passive component 153 may be a chip component, for example, a high-frequency inductor, a ferrite inductor, a power inductor, ferrite beads, low temperature Co-Firing Ceramics (LTCC), Electro Magnetic Interference (EMI), Multi-Layer Ceramic Capacitor (MLC), and Land Side Capacitor (LSC), but the present disclosure is not limited thereto.

The passive component 153 may be mounted on the second resist layer 142 through one or more third connection members 163. For example, the passive component 153 may be electrically connected to the conductor pattern layer, for example, the fourth conductor pattern layer 124, which is disposed in the lowest side of the build-up unit through one or more third connection members 163. Each of the one or more third connection members 163 may be formed of a low melting point metal, for example, a solder such as tin (Sn)-aluminum (Al)-copper (Cu), or the like, but this is only an example, and the material is not particularly limited thereto.

The plurality of fourth connection members 164 are configured to connect the printed circuit board 100 to a main board or other substrates of an electronic device. Each of a plurality of fourth connection members 164 may be electrically connected to the conductor pattern layer, for example, the fourth conductor pattern layer 124, which is disposed on the lowest side of the build-up unit. If necessary, the plurality of fourth connection members 164 may be disposed through an underbump metal formed of a known metal material. The plurality of fourth connection members 164 can be formed of a conductive material, such as a solder, etc., but this is only an example, and the material is not particularly limited thereto. Each of the plurality of fourth connection members 164 may be a land, a ball, and a pin. Each of the plurality of fourth connection members 164 may be implemented as a multilayer or a single layer structure. When the plurality of fourth connection members 164 are formed in multiple layers, a copper pillar and a solder may be included, and when the plurality of fourth connection members 164 are formed as a single layer, tin-silver may include solder or copper, but the present disclosure is not limited thereto.

Figure 4:
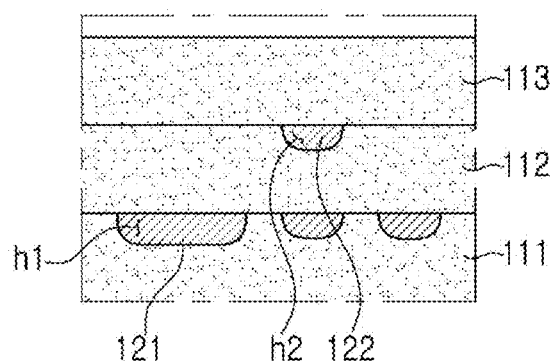
FIG. 4 is a process cross-sectional view schematically illustrating the formation of a conductor pattern layer and a via conductor of the printed circuit board of FIG. 3.
Figure 4:
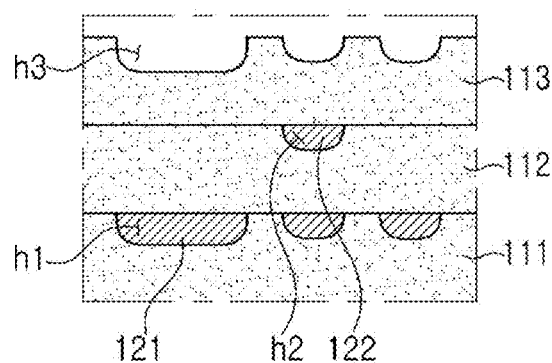
Figure 4:
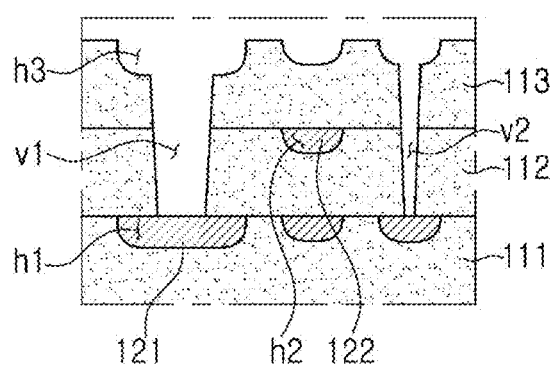
Figure 4:
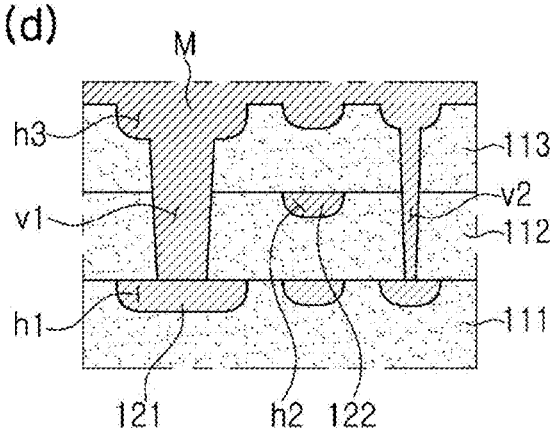
Figure 4:
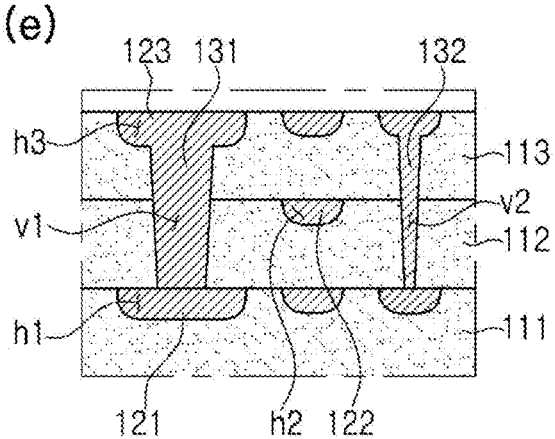

FIG. 4 is a process cross-sectional view schematically illustrating the formation of a conductor pattern layer and avia conductor of the printed circuit board of FIG. 3.

Referring to (a) of FIG. 4, a laminate including the first to third insulating layers 111, 112 and 113 and the plurality of first and second concave portions h1 and h2, and the first and second conductor pattern layers 121 and 122 is prepared. The first to third insulating layers 111, 112 and 113 may be formed through a stacking process of an insulating material, and the plurality of first and second concave portions h1 and h2 and the first and second conductor pattern layers 121 and 122 may be formed with reference to a process described below.

Referring to (b) of FIG. 4, the plurality of third concave portions h3 having various widths and depths are formed in the third insulating layer 113. The plurality of third concave portions h3 may be formed by generating desired depths through laser processing, for example, excimer laser processing. Alternatively, ultraviolet (UV) laser processing may be used to generate the desired depths.

Referring to (C) of FIG. 4, the first and second via holes v1 and v2 penetrating through the second and third insulating layers 112 and 113 from different one of the plurality of third concave portions h3 respectively in different widths are formed. The first and second via holes v1 and v2 may also be formed by generating desired depths through laser processing, for example, excimer laser processing. Alternatively, ultraviolet (UV) laser processing may be used to generate the desired depths.

Referring to (D) of FIG. 4, the plurality of third concave portions h3 and first and second via holes v1 and v2 are filled with the metal layer M using a plating process. For example, the metal layer M may be formed in a way of forming the seed layer by electroless plating and/or sputtering and forming the plating layer on the seed layer by electrolytic plating.

Referring to (E) of FIG. 4, an over-plated metal layer M on the third insulating layer 113 is removed by a planarization process. As the planarization process, a chemical mechanical polishing (CMP) process may be used, but the present disclosure is not limited thereto. After the planarization process, the third conductor pattern layer 123 and the first and second via conductors 131 and 132 may be formed.

Other descriptions are substantially the same as those described in the printed circuit board 100 according to the above-described example embodiment, and thus redundant descriptions will be omitted. On the other hand, other components of the printed circuit board 100 according to one example embodiment, such as, a plurality of fourth concave portions h4, the fourth conductor pattern layer 124, the third to fifth via holes v3, v4 and v5, and the third to fifth via conductors 133, 134 and 135, may be formed through substantially the same process as the process described with reference to FIG. 4, and redundant descriptions thereof will be omitted.

Figure 5:
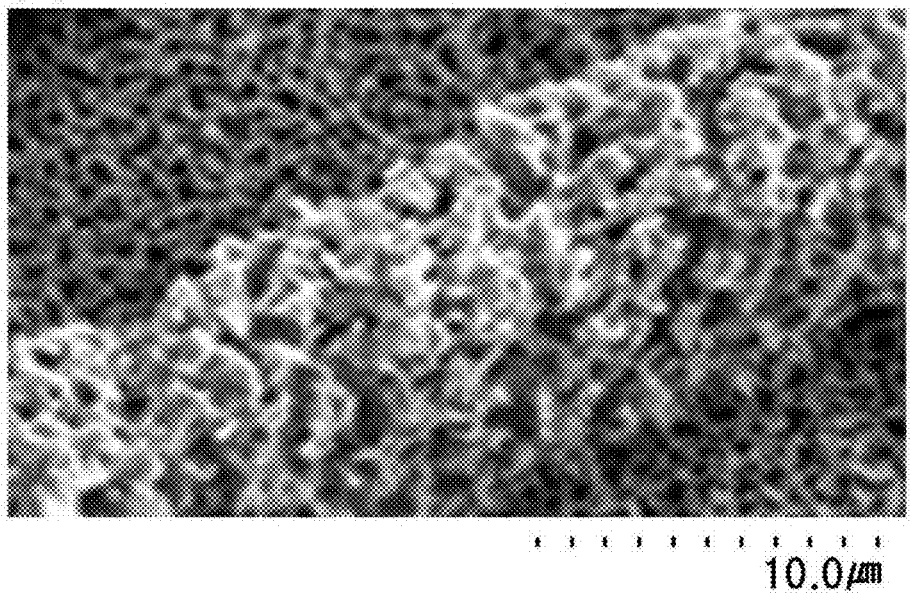
FIG. 5 is an image diagram schematically illustrating a comparison between a surface roughness of a conductor circuit when a conductor circuit is formed using etching and a surface roughness of a conductor circuit when the conductor circuit is formed according to an example embodiment of the present disclosure.
Figure 5:
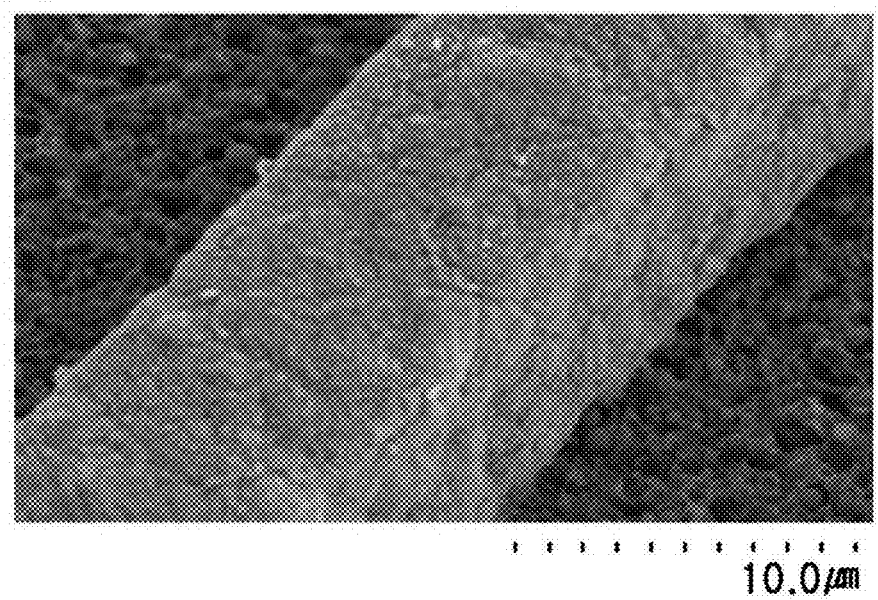

FIG. 5 is an image diagram schematically illustrating a comparison between a surface roughness of a conductor circuit when a conductor circuit is formed using etching and a surface roughness of a conductor circuit when the conductor circuit is formed according to an example embodiment of the present disclosure.

Referring to (A) of FIG. 5, the conductor circuit formed by a semi additive process (SAP) or modified SAP (MSAP) using an etching process has a considerable surface roughness. However, with reference to (B) of FIG. 5, it can be seen that since the conductor circuit formed according to the present disclosure does not use an etching process, there is little surface roughness of the conductor circuit. Accordingly, since the conductor circuit formed according to the present disclosure may have a more excellent effect in terms of signal loss, it may be advantageous for high-frequency signal transmission.

Figure 6:
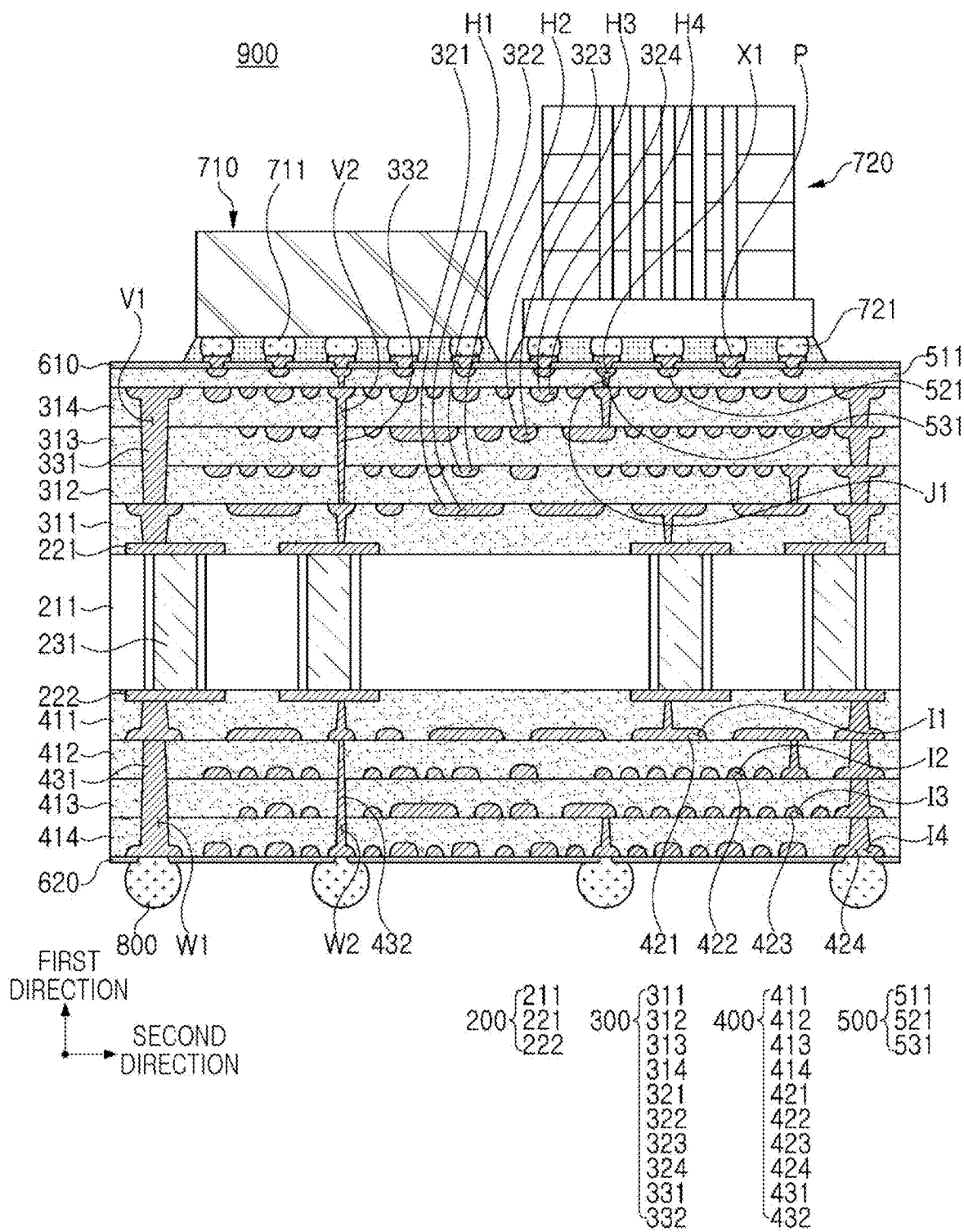
FIG. 6 is a cross-sectional view schematically illustrating another example embodiment of a printed circuit board.

FIG. 6 is a cross-sectional view schematically illustrating another example embodiment of a printed circuit board.

Referring to FIG. 6, the printed circuit board 900 according to another example embodiment may be a core-type substrate including a core unit 200 and first and second build-up units 300 and 400 disposed on an upper side and a lower side of the core unit 200, respectively, with respect to the first direction. In this case, the content as described in the build-up unit of the printed circuit board 100 according to the above-described example embodiment may be applied to the first and second build-up units 300 and 400 in substantially the same manner. For example, the first and second build-up units 300 and 400 may have a structure in which a concave portion is formed in each of the insulating layers and then filled with a conductor to form a conductor pattern layer. Accordingly, the circuits of the inner layer as well as the outermost layer may be formed in the buried trace structure to realize fine lines/spaces and fine vias. In addition, since the conductor pattern layer can be formed without etching, each surface of the conductor pattern layers can have a smooth shape with little surface roughness, and the signal path can be shortened in the skin effect, minimizing signal loss under the high frequency condition, and improving SI characteristics. In addition, the thickness of the circuit pattern may be adjusted in various ways, which makes it possible to easily perform impedance management and may also have a PI improvement effect. In addition, since the depth and width of the via may be formed in various ways, the degree of design freedom can be improved, thereby improving PI characteristics and SI characteristics. Furthermore, in addition to the seamless via, the above-described various types of via for interlayer connection may be applied to the printed circuit board 900. In addition, the printed circuit board 900 may be configured in multiple layers than illustrated in FIG. 6.

Meanwhile, the core-type substrate may further include a third build-up unit 500 disposed on the first build-up unit 300. The content described in the build-up unit of the printed circuit board 100 according to the above-described example embodiment may be substantially identically applied to the third build-up unit 500. In addition, the wiring density of the conductor pattern layer included in the third build-up unit 500 may be higher than that of the conductor pattern layer included in each of the first and second build-up units 300 and 400. For example, the conductor pattern layer of the third build-up unit 500 may include high-density wiring having a relatively fine pitch, and the conductor pattern layers of each of the first and second build-up units 300 and 400 may include a relatively low-density wiring. For example, the conductor pattern layer of the third build-up unit 500 may have a relatively smaller wiring thickness, line/space and pitch than the conductor pattern layers of each of the first and second build-up units 300 and 400. In addition, an interlayer insulation distance between the conductor pattern layers may also be relatively thinner.

On the other hand, the core-type substrate may further include a first resist layer 610 disposed on an upper side of the third build-up unit 500 with respect to the first direction, the second resist layer 620 disposed on a lower side of the second build-up unit 400 with respect the first direction, first and second semiconductor chips 710 and 720 mounted above an upper side of the first resist layer 610 with respect to the first direction through a plurality of first and second connection members 711 and 721 and electrically connected to each other through the third build-up unit 500, a plurality of third connecting members 800 disposed in a lower side of the second resist layer 620 with respect to the first direction and electrically connected to the second build-up unit 400, respectively.

Hereinafter, with reference to the drawings, components of the printed circuit board 900 according to another example embodiment will be described in more detail.

The core unit 200 may include a core layer 211, a first and second wiring layers 221 and 222 disposed on upper and lower surfaces of the core layer 211, respectively, and a through via 231 penetrating through the core layer 211 and connecting the first and second wiring layers 221 and 222.

The core layer 211 may include an insulating material. The insulating material may be a thermosetting resin such as an epoxy resin, a thermoplastic resin such as a polyimide resin, a resin in which these insulating resins are mixed with an inorganic filler such as silica or are impregnated together with an inorganic filler in a core material such as a glass fiber (or a glass cloth or a glass fabric), for example, a copper clad laminate (CCL), or the like, but the present disclosure is not limited thereto. The core layer 211 may be thicker than each of the insulating layers constituting the first to third build-up units 300, 400 and 500, but the present disclosure is not limited thereto.

Each of the first and second wiring layers 221 and 222 may include a metal material. The metal material may be copper (Cu), aluminum (Al), silver (Ag), tin (Sn), gold (Au), nickel (Ni), lead (Pb), titanium (Ti), or alloys thereof. The first and second wiring layers 221 and 222 may include an electroless plating layer (or chemical copper) and an electrolytic plating layer (or electric copper), but the present disclosure is not limited thereto. As the electroless plating layer, the sputtering layer may be formed instead of chemical copper. If necessary, a copper foil may be further included. Each of the first and second wiring layers 221 and 222 may perform various functions according to the design of the corresponding layer. For example, the first and second wiring layers 221 and 222 may include a ground pattern, a power pattern, and a signal pattern. Here, the signal pattern may include various signals except the ground pattern and the power pattern, for example, a data signal. Each of these patterns may include a line pattern, a plane pattern, and/or a pad pattern.

The through via 231 may include a metal layer formed on a wall surface of a through hole and a plug filling the metal layer. The metal layer may include a metal material such as copper (Cu), aluminum (Al), silver (Ag), tin (Sn), gold (Au), nickel (Ni), lead (Pb), titanium (Ti), or alloys thereof. The plug may include ink made of an insulating material. The metal layer may include an electroless plating layer (or chemical copper) and an electrolytic plating layer (or electric copper), but the present disclosure is not limited thereto.

As the electroless plating layer, the sputtering layer may be formed instead of chemical copper. The through via 231 may perform various functions according to designs of the corresponding layer. For example, a ground via, a power via, a signal via, and the like may be included. Here, the signal via may include various signals except the ground via and the power via, for example, a via for transmitting a data signal.

The first build-up part 300 may include first-first to first-fourth insulating layers 311, 312, 313 and 314 each having a plurality of first-first to first-fourth concave portions H1, H2, H3 and H4 and stacked in the first direction, first-first to first-fourth conductor pattern layers 321, 322, 323 and 324 filling the first-first to first-fourth concave portions H1, H2, H3 and H4, respectively, first-first and first-second via holes V1 and V2 penetrating first-second to first-fourth insulating layers 312, 313 and 314 from different one of the plurality of first-fourth concave portions H4 to the other portion of the first-first conductor pattern layer 321, respectively, first-first and first-second via conductors 331 and 332 filling the first-first and first-second via holes V1 and V2 and electrically connecting the first-first and first-fourth conductor pattern layers 321 and 324 in different positions.

The described content of the plurality of first to third concave portion h1, h2 and h3, the first to third insulating layers 111, 112 and 113, the first to third conductor pattern layers 121, 122 and 123, the first and second via holes v1 and v2, and the first and second via conductors 131 and 132 of the printed circuit board 100 according to the above-mentioned example embodiment may be substantially identically applied to the detailed description of the plurality of first-first to first-fourth concave portions H1, H2, H3 and H4, the first-first to first-fourth insulating layers 311, 312, 313 and 314, the first-first to first-fourth conductor pattern layers 321, 322, 323 and 324, the first-first and first-second via holes V1 and V2, and the first-first and first-second via conductors 331 and 332.

The second build-up unit 400 may include second-first to second-fourth insulating layers 411, 412, 413 and 414 each having a plurality of second-first to second-fourth concave portions 11, 12, 13 and 14 and stacked in the first direction, second-first to second-fourth conductor pattern layers 421, 422, 423 and 424 filling the second-first to second-fourth concave portions 11, 12, 13 and 14, respectively, second-first and second-second via holes W1 and W2 penetrating the second-second to second-fourth insulating layers 412, 413 and 414, respectively, from different one of the plurality of second-fourth concave portions 14 to the other portion of the second-first conductor pattern layer 421, and second-first and second-second via conductors 431 and 432 filling the second-first and second-second via holes W1 and W2, respectively, and electrically connecting the second-first and second-fourth conductor pattern layers 421 and 424 in different positions. The described content of the plurality of first to third concave portions h1, h2 and h3, the first to third insulating layers 111, 112 and 113, the first to third conductor pattern layers 121, 122 and 123, the first and second via holes v1 and v2, and the first and second via conductors 131 and 132 of the printed circuit board 100 according to the above-mentioned example embodiment may be substantially identically applied to the detailed description of the plurality of second-first to second-fourth concave portions 11, 12, 13 and 14, the second-first to second-fourth insulating layers 411, 412, 413 and 414, second-first to second-fourth conductor pattern layers 421, 422, 423 and 424, the second-first and second-second via holes W1 and W2, and the second-first and second-second via conductors 431 and 432.

The third build-up unit 500 may include a third-first insulating layer 511 having a plurality of third-first concave portions J1, a third-first conductor pattern layer 521 filling the plurality of third-first concave portions J1, a third-first via hole X1 penetrating the third-first insulating layer 511 from one of the plurality of third-first concave portions J1 to an uppermost conductor pattern layer of the first build-up unit 300, and a third-first via conductor 531 filling the third-first via hole X1 and electrically connecting the third-first conductor pattern layer 521 to the uppermost conductor pattern layer of the first build-up portion 300.

The described content of the plurality of first to third concave portions h1, h2 and h3, the first to third insulating layers 111, 112 and 113, the first to third conductor pattern layers 121, 122 and 123, the first and second via holes v1 and v2, and the first and second via conductors 131 and 132 of the printed circuit board 100 according to the above-mentioned example embodiment may be substantially identically applied to the detailed description of the plurality of third-first concave portions J1, the third-first insulating layer 511, the third-first conductor pattern layer 521, the third-first via hole X1, and the third-first via conductor 531.

An underbump metal P connected to at least a portion of a conductor pattern layer disposed on an uppermost side of the third build-up unit 500, for example, at least a portion of the third-first conductor pattern layer 521, respectively, may be formed in the first resist layer 610. The second resist layer 620 may have a plurality of openings exposing at least a portion of a conductor pattern layer disposed at a lowest side of the second build-up unit 400, for example, at least a portion of the second-fourth conductor pattern layer 424. The described content of the first and second resist layers 141 and 142 of the printed circuit board 100 according to the above-mentioned example embodiment may be substantially identically applied to other contents.

Each of the plurality of third connection members 800 may be electrically connected to a conductor pattern layer disposed in the lowest side of the second build-up unit 400, for example, the second-fourth conductor pattern layer 144, respectively. The plurality of fourth connection members 164 of the printed circuit board 100 according to the above-mentioned example embodiment may be substantially identically applied to other contents.

In the present disclosure, a thickness, a width, a line, a space, a pitch, etc., may be measured using a scanning microscope or an optical microscope, for example, an optical microscope (×1000) manufactured by Olympus, based on a polishing or cutting cross section of the printed circuit board. When figures thereof do not remain constant, they may be compared with an average value of the values measured at any of five points.

In the present disclosure, a substantial meaning may include a slight difference due to a process error. For example, substantially the same thickness may include not only a case in which the thickness is completely the same, but also a case in which the thickness is approximately the same due to the process error. In addition, substantially completely filling may include a case in which a fine space caused by a void or the like exists. In addition, being substantially flat may include a fine thickness deviation.

In the present disclosure, the meaning on the cross-section may refer to a cross-sectional shape when an object is vertically cut, or a cross-sectional shape when the object is viewed as a side-view. In addition, the meaning on the plane may refer to a shape when the object is cut horizontally, or a planar shape when the object is viewed as a top-view or bottom-view.

In the present disclosure, a lower side, a lower portion, a lower surface, and the like, are used to refer to a direction toward a mounted surface of a semiconductor package including an organic interposer, for convenience, based on a cross section of the drawings, while an upper side, an upper portion, an upper surface, and the like, are used to refer to an opposite direction to the direction. However, these directions are defined for convenience of explanation, and he claims are not particularly limited by the direction described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present disclosure as defined by the appended claims.

What is claimed is:

1. A printed circuit board, comprising:
a plurality of insulating layers each having a plurality of concave portions;
a plurality of conductor pattern layers disposed in the plurality of concave portions of each of the plurality of insulating layers;
first and second via holes connected to one of the plurality of concave portions independently of each other and penetrating through at least two of the plurality of insulating layers independently of each other; and
first and second via conductors disposed in the first and second via holes, respectively, and connecting two of the plurality of conductor pattern layers independently of each other,
wherein an average width of the first via conductor is greater than that of the second via conductor on a cross section.

2. The printed circuit board according to claim 1,
wherein the two of the plurality of conductor pattern layers connected to the first via conductor include a power pattern connected to the first via conductor, respectively, and
the two of the plurality of conductor pattern layers connected to the second via conductor include a signal pattern connected to the second via conductor, respectively.

3. The printed circuit board according to claim 1,
wherein an upper surface of each of the plurality of conductor pattern layers is substantially coplanar with an upper surface of each of the plurality of insulating layers.

4. The printed circuit board according to claim 3,
wherein a lower surface of each of the plurality of conductor pattern layers has a rounded edge.

5. The printed circuit board according to claim 1,
wherein at least one of the plurality of insulating layers includes a plurality of concave portions having different depths.

6. The printed circuit board according to claim 1,
wherein each of the plurality of conductor pattern layers includes a first metal layer covering an inner wall of each of the plurality of concave portions and a second metal layer disposed on the first metal layer to be disposed in each of the plurality of concave portions.

7. The printed circuit board according to claim 6,
wherein the first metal layer includes at least one of an electroless plating layer and a sputtering layer, and
the second metal layer includes an electrolytic plating layer.

8. The printed circuit board according to claim 1,
wherein the printed circuit board is a coreless type substrate including a build-up unit, and
the build-up unit includes the plurality of insulating layers, the plurality of conductor pattern layers, the first and second via holes, and the first and second via conductors.

9. The printed circuit board according to claim 8,
wherein the coreless type substrate includes:
first and second resist layers disposed on an upper side and a lower side of the build-up unit, respectively, with respect to a first direction,
a plurality of semiconductor chips mounted on an upper side of the first resist layer, respectively, with respect to the first direction and connected to the build-up unit through a plurality of connection members,
a passive component mounted on a lower side of the second resist layer with respect to the first direction and connected to the build-up unit, and
the plurality of connection members disposed on a lower side of the second resist layer with respect to the first direction and connected to the build-up unit, respectively.

10. The printed circuit board according to claim 1,
wherein the printed circuit board is a core type substrate including a core unit and first and second build-up units respectively disposed on an upper side and a lower side of the core unit with respect to a first direction, and
at least one of the first and second build-up units includes the plurality of insulating layers, the plurality of conductor pattern layers, the first and second via holes, and the first and second via conductors.

11. The printed circuit board according to claim 10,
wherein the core type substrate further includes a third build-up unit disposed on the first build-up unit with respect to the first direction, and a conductor pattern layer included in the third build-up unit has a higher wiring density than a conductor pattern layer included in each of the first and second build-up units.

12. The printed circuit board according to claim 11, wherein the core type substrate includes a first resist layer disposed on an upper side of the third build-up unit with respect to the first direction, a second resist layer disposed on a lower side of the second build-up unit with respect to the first direction, a plurality of semiconductor chips mounted on an upper side of the first resist layer, respectively, with respect to the first direction, and connected to each other through a plurality of connection members via the third build-up unit, and the plurality of connection members disposed on a lower side of the second resist layer with respect to the first direction and connected to the second build-up unit, respectively.

13. A printed circuit board, comprising:

first to third insulating layers each having a plurality of first to third concave portions and stacked in a first direction;

first to third conductor pattern layers disposed in the plurality of first to third concave portions, respectively;

first and second via holes penetrating the second and third insulating layers, respectively, from different one of the plurality of third concave portions to the other portion of the first conductor pattern layer; and first and second via conductors disposed in the first and second via holes, respectively, and connecting the first and third conductor pattern layers in different positions, wherein at the same level with respect to the first direction, a width of the first via hole in a second direction perpendicular to the first direction is greater than that of the second via hole.

14. The printed circuit board according to claim 13, wherein the first and third conductor pattern layers include a power pattern and a signal pattern, respectively, the first via conductor connects power patterns of each of the first and third conductor pattern layers, and the second via conductor connects signal patterns of each of the first and third conductor pattern layers.

15. The printed circuit board according to claim 13, further comprising:

a third via hole penetrating the third insulating layer from one of the plurality of third concave portions to a portion of the second conductor pattern layer;

a fourth via hole penetrating the second insulating layer from one of the plurality of second concave portions to a portion of the first conductor pattern layer;

a third via conductor disposed in the third via hole and connecting the second and third conductor pattern layers; and a fourth via conductor disposed in the fourth via hole and connecting the first and second conductor pattern layers.

16. The printed circuit board according to claim 13, further comprising:

a fourth insulating layer having a plurality of fourth concave portions and stacked on a lower side of the first insulating layer with respect to the first direction;

a fourth conductor pattern layer disposed in the plurality of fourth concave portions;

a fifth via hole penetrating the first insulating layer from one of the plurality of first concave portions to a portion of the fourth conductor pattern layer; and a fifth via conductor disposed in the fifth via hole and connecting the first and fourth conductor pattern layers.

17. The printed circuit board according to claim 13, further comprising:

a fifth insulating layer having a plurality of fifth concave portions and disposed between the first and second insulating layers or between the second and third insulating layers with respect to the first direction; and a fifth conductor pattern layer disposed in the plurality of fifth concave portions, wherein each of the first and second via holes further penetrates the fifth insulating layer.

18. A printed circuit board, comprising:

a first insulating layer having first and second concave portions;

first and second conductor patterns disposed in the first and second concave portions, respectively;

a second insulating layer disposed on the first insulating layer and having third and fourth concave portions;

third and fourth conductor patterns disposed in the third and fourth concave portions, respectively; and a first via conductor disposed in the second insulating layer to connect the first and third conductor patterns to each other, wherein the third conductor pattern has a width greater than that of the fourth conductor pattern, and the third conductor pattern has a depth greater than that of the fourth conductor pattern.

19. The printed circuit board according to claim 18, wherein a lower surface of each of the third and fourth conductor patterns has a rounded edge.

20. The printed circuit board according to claim 18, further comprising a second via conductor disposed in the second insulating layer to connect the second and fourth conductor patterns to each other, wherein an average width of the first via conductor is greater than that of the second via conductor.

* * * * *